US011561297B2

(12) United States Patent
Sasaki et al.

(10) Patent No.: US 11,561,297 B2
(45) Date of Patent: Jan. 24, 2023

(54) THERMAL EXCITATION ACOUSTIC-WAVE-GENERATING DEVICE AND ACOUSTIC-WAVE-GENERATING SYSTEM

(71) Applicant: Murata Manufacturing Co., Ltd., Nagaokakyo (JP)

(72) Inventors: Shinichi Sasaki, Nagaokakyo (JP); Takaaki Asada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 235 days.

(21) Appl. No.: 16/886,835

(22) Filed: May 29, 2020

(65) Prior Publication Data
US 2020/0292683 A1    Sep. 17, 2020

Related U.S. Application Data

(63) Continuation of application No. PCT/JP2018/032209, filed on Aug. 30, 2018.

(30) Foreign Application Priority Data

Feb. 19, 2018    (JP) .............................. JP2018-027319

(51) Int. Cl.
*G01S 7/521*    (2006.01)
*H01L 41/09*    (2006.01)
*H04R 23/00*    (2006.01)

(52) U.S. Cl.
CPC .............. *G01S 7/521* (2013.01); *H01L 41/09* (2013.01); *H04R 23/002* (2013.01)

(58) Field of Classification Search
CPC ........ H04R 23/002; H04R 3/00; H04R 23/00; H04R 1/34; G01S 7/521; G01S 7/524; G01S 15/04; G01S 15/10; H01L 41/09
See application file for complete search history.

(56) References Cited

U.S. PATENT DOCUMENTS

| 5,228,093 A | * | 7/1993 | Agnello | ................. | H04H 60/04 |
| | | | | | 381/103 |
| 8,259,967 B2 | * | 9/2012 | Feng | .................... | H04R 23/002 |
| | | | | | 381/164 |

(Continued)

FOREIGN PATENT DOCUMENTS

| CN | 103841478 A | 6/2014 |
| JP | 11-300274 A | 11/1999 |

(Continued)

OTHER PUBLICATIONS

Official Communication issued in corresponding Chinese Patent Application No. 201880083448.0, dated Oct. 28, 2020.

(Continued)

*Primary Examiner* — Daniel L Murphy
*Assistant Examiner* — Amie M Ndure
(74) *Attorney, Agent, or Firm* — Keating & Bennett, LLP

(57) ABSTRACT

A thermal excitation acoustic-wave-generating device includes a first heating element, a substrate that includes a main surface along which the first heating element is disposed, and a facing body that faces the substrate with the first heating element interposed therebetween. The substrate and the facing body define a path for an acoustic wave. A length of the path is close to a whole number multiple of ¼ of a wavelength of the acoustic wave.

16 Claims, 12 Drawing Sheets

(56) References Cited

U.S. PATENT DOCUMENTS

| | | | |
|---|---|---|---|
| 10,779,089 B1* | 9/2020 | Schumacher | G10K 15/04 |
| 2010/0046774 A1* | 2/2010 | Feng | H04R 23/002 |
| | | | 977/932 |
| 2010/0172216 A1* | 7/2010 | Liu | H04R 23/002 |
| | | | 367/140 |
| 2012/0250464 A1* | 10/2012 | Jiang | H04R 23/002 |
| | | | 367/140 |
| 2013/0155723 A1* | 6/2013 | Coleman | G02B 6/0036 |
| | | | 362/621 |
| 2014/0140529 A1* | 5/2014 | Wei | H04R 1/1091 |
| | | | 381/74 |
| 2015/0369663 A1* | 12/2015 | Margalit | F25B 21/02 |
| | | | 62/3.2 |
| 2016/0146039 A1* | 5/2016 | Braden | G10K 11/17861 |
| | | | 381/71.8 |
| 2019/0068265 A1* | 2/2019 | Lee | H04B 7/088 |
| 2019/0094140 A1* | 3/2019 | Han | G01N 15/0205 |

FOREIGN PATENT DOCUMENTS

| | | | | |
|---|---|---|---|---|
| JP | 2003-154312 A | | 5/2003 | |
| JP | 2003154312 A | * | 5/2003 | G10K 15/04 |
| JP | 2007-255924 A | | 10/2007 | |
| JP | 2007255924 A | * | 10/2007 | |
| JP | 2008-167252 A | | 7/2008 | |
| JP | 2009-118093 A | | 5/2009 | |
| JP | 2009118093 A | * | 5/2009 | |
| WO | 2018/096215 A1 | | 5/2018 | |

OTHER PUBLICATIONS

Official Communication issued in International Patent Application PCT/JP2018/032209, dated Nov. 13, 2018.

* cited by examiner

FIG. 6A
PULSE SIGNAL Sp
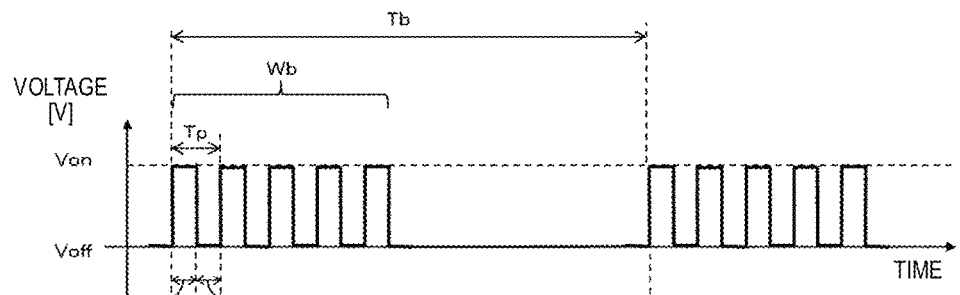
FIG. 6B
ACOUSTIC WAVE
FIG. 7
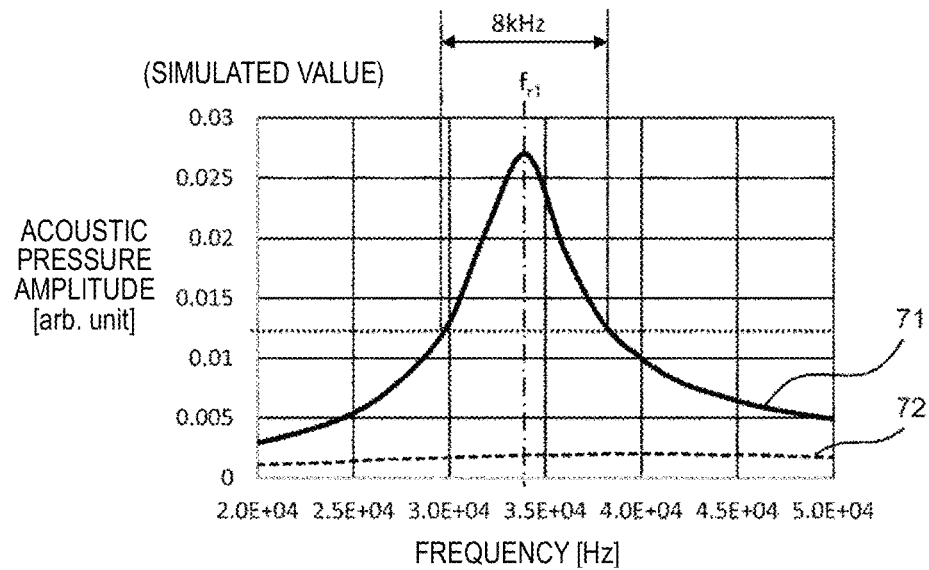

THERMAL EXCITATION ACOUSTIC-WAVE-GENERATING DEVICE AND ACOUSTIC-WAVE-GENERATING SYSTEM

CROSS REFERENCE TO RELATED APPLICATIONS

This application claims the benefit of priority to Japanese Patent Application No. 2018-027319 filed on Feb. 19, 2018 and is a Continuation Application of PCT Application No. PCT/JP2018/032209 filed on Aug. 30, 2018. The entire contents of each application are hereby incorporated herein by reference.

BACKGROUND OF THE INVENTION

1. Field of the Invention

The present invention relates to a thermal excitation acoustic-wave-generating device and an acoustic-wave-generating system that generate an acoustic wave by heating air.

2. Description of the Related Art

Japanese Unexamined Patent Application Publication No. 2008-167252 discloses a thermal excitation acoustic-wave-generating device that includes a thermally conductive substrate, a thermal insulation layer that is formed on a surface of the substrate, and a heating-element thin film that is a resistor that is formed on the thermal insulation layer and that is electrically driven by using an alternating signal current. The acoustic-wave-generating device includes a Helmholtz resonator on the heating-element thin film. The Helmholtz resonator includes a resonance box that covers a space above the heating-element thin film and a duct having a through-hole that is formed in the ceiling of the resonance box. In this case, Helmholtz resonance occurs inside the resonance box. Natural frequency is defined by the volume (corresponding to a spring constant) of the resonance box and the mass of an air column in the duct. Accordingly, the volume of the resonance box and the shape of the duct are determined such that a desired frequency in an audible frequency band is obtained. In this way, an acoustic wave that has a low frequency in the audible frequency band is efficiently generated.

SUMMARY OF THE INVENTION

Preferred embodiments of the present invention provide thermal excitation acoustic-wave-generating devices and acoustic-wave-generating systems that each improve efficiency with which an acoustic wave is generated.

A thermal excitation acoustic-wave-generating device according to a preferred embodiment of the present invention includes a first heating element, a substrate that includes a main surface along which the first heating element is disposed, and a facing body that faces the substrate with the first heating element interposed therebetween. The substrate and the facing body define a path for an acoustic wave. A length of the path is close to a whole number multiple of ¼ of a wavelength of the acoustic wave.

An acoustic-wave-generating system according to a preferred embodiment of the present invention includes a thermal excitation acoustic-wave-generating device that generates an acoustic wave, and a driving device that supplies a driving signal to the acoustic-wave-generating device. The wavelength of the acoustic wave is defined by the driving signal.

Thermal excitation acoustic-wave-generating devices and acoustic-wave-generating systems according to preferred embodiments of the present invention are each able to improve efficiency with which an acoustic wave is generated.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A and 6B illustrate the period of the acoustic wave in the thermal excitation acoustic-wave-generating device according to the first preferred embodiment of the present invention.

FIG. 7 is a graph illustrating the result of a simulation of the thermal excitation acoustic-wave-generating device according to the first preferred embodiment of the present invention.

DETAILED DESCRIPTION OF THE PREFERRED EMBODIMENTS

Thermal excitation acoustic-wave-generating devices and acoustic-wave-generating systems according to preferred embodiments of the present invention use air column resonance to improve efficiency with which an acoustic wave is generated. Thermal excitation acoustic-wave-generating devices and acoustic-wave-generating systems according to preferred embodiments of the present invention will hereinafter be described with reference to the drawings.

Preferred embodiments will be described by way of examples, and structures and configurations described according to the different preferred embodiments can be partially replaced or combined. In descriptions according to a second preferred embodiment or later, descriptions of matters common to those according to a first preferred embodiment are omitted, and only differences will be described. In particular, the same or similar advantageous effects achieved by the same or similar structures and configurations are not described for every preferred embodiment.

First Preferred Embodiment

1. Structure

Figure 1:
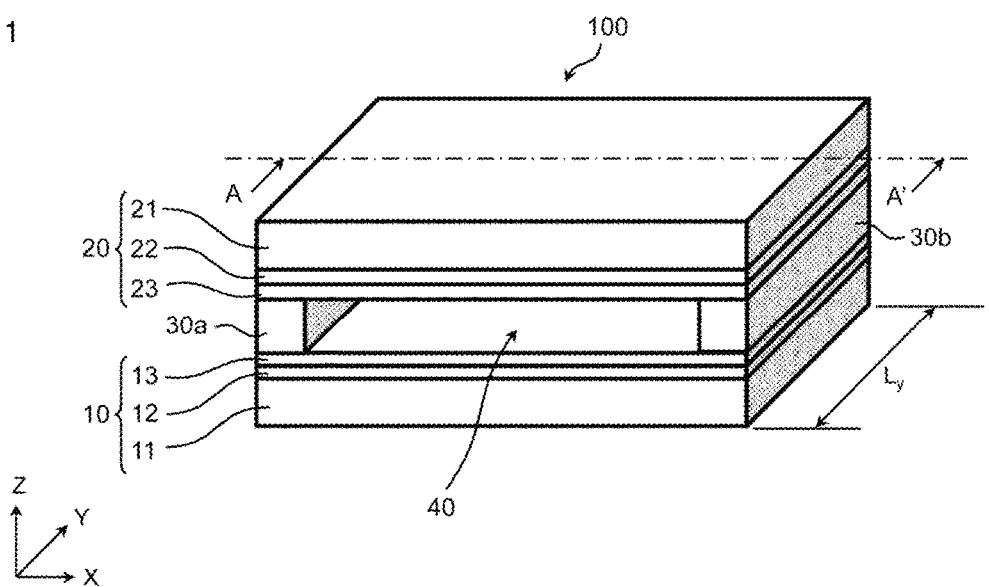
FIG. 1 is a perspective view of the structure of a thermal excitation acoustic-wave-generating device according to a first preferred embodiment of the present invention.
Figure 2:
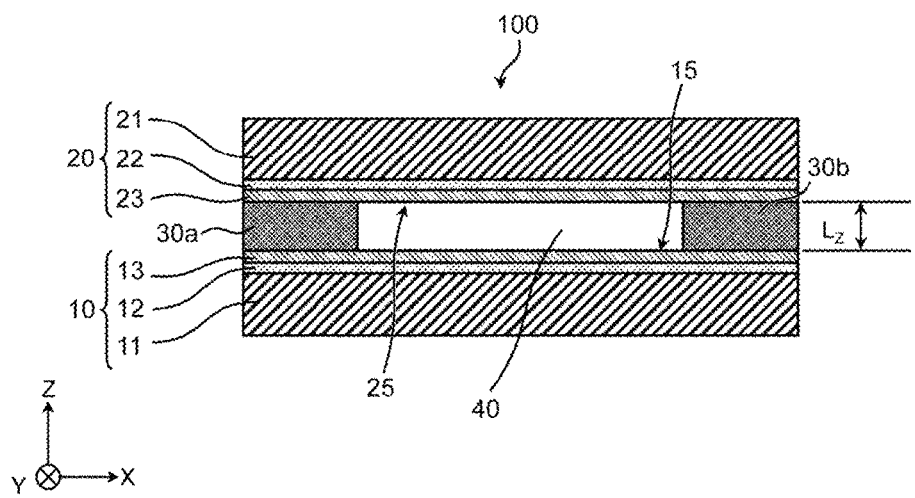
FIG. 2 is a sectional view of the thermal excitation acoustic-wave-generating device according to the first preferred embodiment of the present invention.
Figure 3:
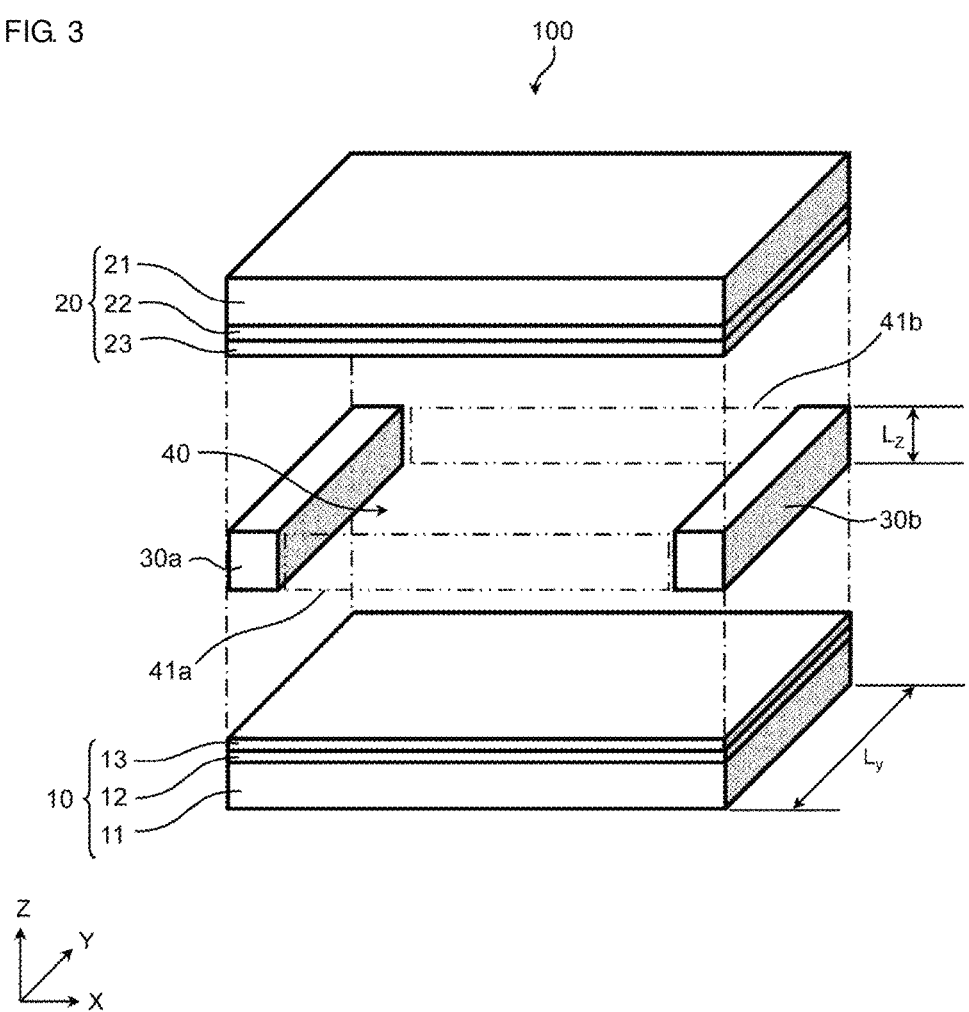
FIG. 3 is an exploded perspective view of the thermal excitation acoustic-wave-generating device according to the first preferred embodiment of the present invention.

The structure of an acoustic-wave-generating device according to a first preferred embodiment of the present invention will be described with reference to FIG. 1 to FIG. 3. FIG. 1 is a perspective view of the structure of a thermal excitation acoustic-wave-generating device 100 according to the present preferred embodiment. FIG. 2 is a sectional view of the acoustic-wave-generating device 100 taken along line A-A' in FIG. 1. FIG. 3 is an exploded perspective view of the acoustic-wave-generating device 100 in FIG. 1. The thermal excitation acoustic-wave-generating device 100 is a thermophone that makes air sparse or dense by alternately repeating heating and cooling of the air and that generates a pressure wave of the air, that is, an acoustic wave. The acoustic-wave-generating device 100 can be used for, for example, a distance sensor such as an ultrasonic sensor that radiates an ultrasonic wave toward a subject and that receives a reflected wave to detect a distance to the subject, or a proximity sensor.

The acoustic-wave-generating device 100 includes a first acoustic wave source 10, a second acoustic wave source 20, and a pair of electrodes 30a and 30b that are disposed between the first acoustic wave source 10 and the second acoustic wave source 20.

The first acoustic wave source 10 includes a substrate 11, a thermal insulation layer 12 that is disposed on a main surface of the substrate 11, and a heating element 13 that is disposed on a main surface of the thermal insulation layer 12 opposite the substrate 11. The second acoustic wave source 20 includes a facing body 21, a thermal insulation layer 22 that is disposed on a main surface of the facing body 21, and a heating element 23 that is disposed on a main surface of the thermal insulation layer 22 opposite the facing body 21. The pair of electrodes 30a and 30b hold the second acoustic wave source 20 above the first acoustic wave source 10. The first acoustic wave source 10 and the second acoustic wave source 20 are located such that the heating elements 13 and 23 face each other. The heating elements 13 and 23 are electrically connected to the common electrodes 30a and 30b.

The substrate 11 and the facing body 21 are insulating substrates that have a flat plate shape. The substrate 11 and the facing body 21 are preferably made of, for example, Si or $Al_2O_3$. Examples of the substrate 11 and the facing body 21 can include a ceramic substrate such as an alumina substrate, a glass substrate that has excellent heat dissipation properties, and a printed circuit board. The thermal insulation layers 12 and 22 are preferably made of, for example, glass glaze, porous Si, or $SiO_2$. For example, the thermal insulation layers 12 and 22 have thermal conductivity less than the thermal conductivity of the substrate 11 and the facing body 21. Examples of the heating elements 13 and 23 include a conductor such as an Ag, Ag/Pd, or $RuO_2$ conductor, a metal film such as an Au or Pt film, or carbon nanotube or sheet. For example, the heating elements 13 and 23 may preferably have a specific heat of about 500 or less [J/kg° C.] and a thermal conductivity of about 50 or more [W/mK]. For example, pattern printing may be performed such that the heating elements 13 and 23 have various shapes on the main surfaces of the substrate 11 and the facing body 21. The electrodes 30a and 30b are preferably made of, for example, a conductive material such as Ag, Ag/Pd, Sn, Al, Au, or Cu. The electrodes 30a and 30b adhere to the heating elements 13 and 23 with, for example, conductive adhesive.

An interior space (also referred to below as a "path") 40 is provided between the first acoustic wave source 10 and the second acoustic wave source 20 and between the electrodes 30a and 30b. The pair of electrodes 30a and 30b is arranged in a Y-direction between the first acoustic wave source 10 and the second acoustic wave source 20. That is, the pair of electrodes 30a and 30b close the interior space 40 in an X-direction. Openings 41a and 41b are provided between the first acoustic wave source 10 and the second acoustic wave source 20 along a front surface and a back surface of the acoustic-wave-generating device 100 in FIG. 1 and FIG. 3. The openings 41a and 41b have a rectangular or substantially rectangular shape. The interior space 40 has a quadrangular or substantially quadrangular prism shape such that the rectangular or substantially rectangular shape of the openings 41a and 41b expands in the Y-direction. The openings 41a and 41b correspond to open ends (free ends) of the interior space 40.

When electric currents (also referred to below as "drive currents") for causing the heating elements 13 and 23 to generate heat are supplied to the heating elements 13 and 23 via the electrodes 30a and 30b, the heating elements 13 and 23 generate the heat. When the heating elements 13 and 23 generate the heat, air near the heating elements 13 and 23 is heated and expanded. After the supply of the drive currents to the heating elements 13 and 23 is stopped, the temperatures of the heating elements 13 and decrease because the substrate 11 and the facing body 21 dissipate the heat of the heating elements 13 and 23. Consequently, the air near the heating elements 13 and 23 is cooled and contracted. The expansion and the contraction of the air causes a pressure wave (that is, an acoustic wave) of the air to be generated in the interior space 40. The pressure wave exits via the openings 41a and 41b. The interior space 40 thus defines and functions as the path for the pressure wave (that is, the acoustic wave) that is generated in the interior space 40.

The pressure wave tends to diffuse in all directions. However, the substrate 11 and the facing body 21 are arranged in the height direction (Z-direction) of the interior space 40, and diffusion in the height direction is restricted. The main surfaces of the substrate 11 and the facing body 21 that face each other, that is, the upper surface of the substrate 11 and the lower surface of the facing body 21 are flat. In other words, an upper surface 15 of the first acoustic wave source 10 and a lower surface 25 of the second acoustic wave source 20 are flat. This reduces or prevents diffusion in an undesired direction from occurring. The flatness of the upper surface of the substrate 11 and the lower surface of the facing body 21 preferably has, for example, a variation of about ⅓ or less of a designed separation distance (corresponding to the height $L_z$ of the interior space 40).

A length $L_y$ of the interior space 40 in a direction (Y-direction) between the opening 41a and the opening 41b, that is, the length of the path is defined by the lengths of the substrate 11 and the facing body 21 in the Y-direction. The height $L_z$ of the interior space 40 is defined by the thicknesses of the electrodes 30a and 30b and the thickness of the conductive adhesive with which the electrodes 30a and 30b and the heating elements 13 and 23 adhere to each other. The height $L_z$ of the interior space 40 is less than the length $L_y$. For example, $L_z$ is preferably less than about 1/10 of $L_y$. Specifically, $L_z$ is preferably about 1 mm or less, for example. $L_z$ may be 1/100 of $L_y$. Specifically, $L_z$ may be about 0.16 mm, for example. This restricts the diffusion of the pressure wave in the height direction and facilitates the diffusion thereof in the horizontal direction.

Under the restriction of the diffusion in the height direction, the pressure wave tends to diffuse in the horizontal direction, that is, in the direction (Y-direction) between the opening 41a and the opening 41b and in the direction (X-direction) between the electrodes 30a and 30b. According to the present preferred embodiment, however, the electrodes 30a and 30b are disposed so as to close the interior space 40 in the X-direction, and the electrodes 30a and 30b define and function as reflectors that reflect the pressure wave in the X-direction within the interior space 40. Accordingly, the pressure wave that diffuses in the horizontal direction in the interior space 40 is reflected from the inner surfaces of the electrodes 30a and 30b and exits via the openings 41a and 41b. That is, the energy of the pressure wave that flows in directions except for the direction (Y-direction) between the openings 41a and 41b can be guided toward the openings along the electrodes 30a and 30b. Accordingly, the energy of the pressure wave that is outputted via the openings 41a and 41b increases. The acoustic wave that is the pressure wave flows in the direction (Y-direction) between the openings 41a and 41b.

Figure 4A:
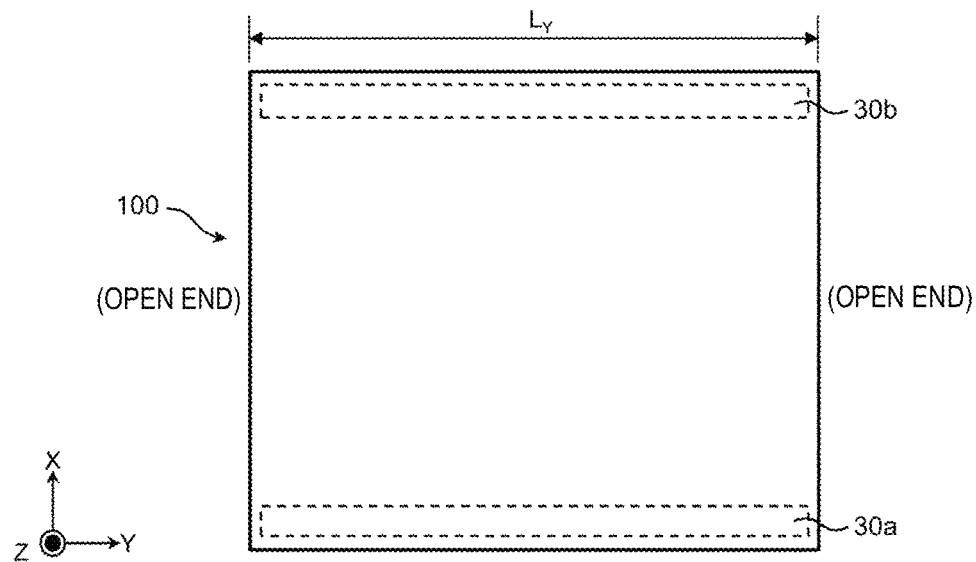
FIGS. 4A and 4B are diagrams for a description of the length of an interior space in a direction in which an acoustic wave propagates in the thermal excitation acoustic-wave-generating device according to the first preferred embodiment of the present invention.
Figure 4B:
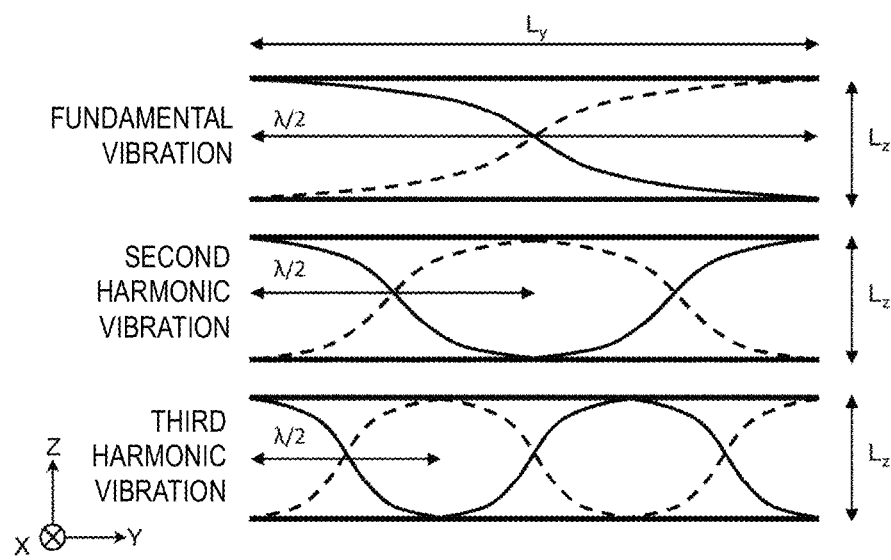

FIG. 4A is a plan view of the acoustic-wave-generating device 100. FIG. 4B illustrates the waveform of the acoustic wave that is the pressure wave and that is generated in the interior space 40.

The acoustic-wave-generating device 100 has an open tube structure that is defined by the first acoustic wave source 10, the second acoustic wave source 20, and the electrodes 30a and 30b. The acoustic-wave-generating device 100 causes air column resonance to occur in the interior space 40 and increases a change in the pressure of the air, that is, acoustic pressure. The air column resonance occurs due to superimposition of waves at a natural frequency that is determined by the length $L_y$ between the openings 41a and 41b. According to the present preferred embodiment, the length $L_y$ of the interior space 40 between the openings 41a and 41b is determined to be a length at which the air column resonance occurs. Specifically, as defined as expression (1), the lengths of the substrate 11 and the facing body 21 in the Y-direction are determined such that the length $L_y$ of the interior space 40 between the openings 41a and 41b is approximately n times (n is an integer, and for example, n=1, 2, or 3) the half wavelength λ/2 of the pressure wave that is generated in the interior space 40. For example, it is determined to be n=1. The wavelength λ of the pressure wave is determined depending on the magnitude of a period (pulse period Tp in FIGS. 6A and 6B) at which the drive currents are supplied to the heating elements 13 and 23 as described later.

[Expression 1]

$$L_y = \frac{\lambda}{2} \times n \qquad (1)$$

2. Operation

The operation of an acoustic-wave-generating system 1 according to the present preferred embodiment will be described with reference to FIG. 5 to FIG. 8.

Figure 5:
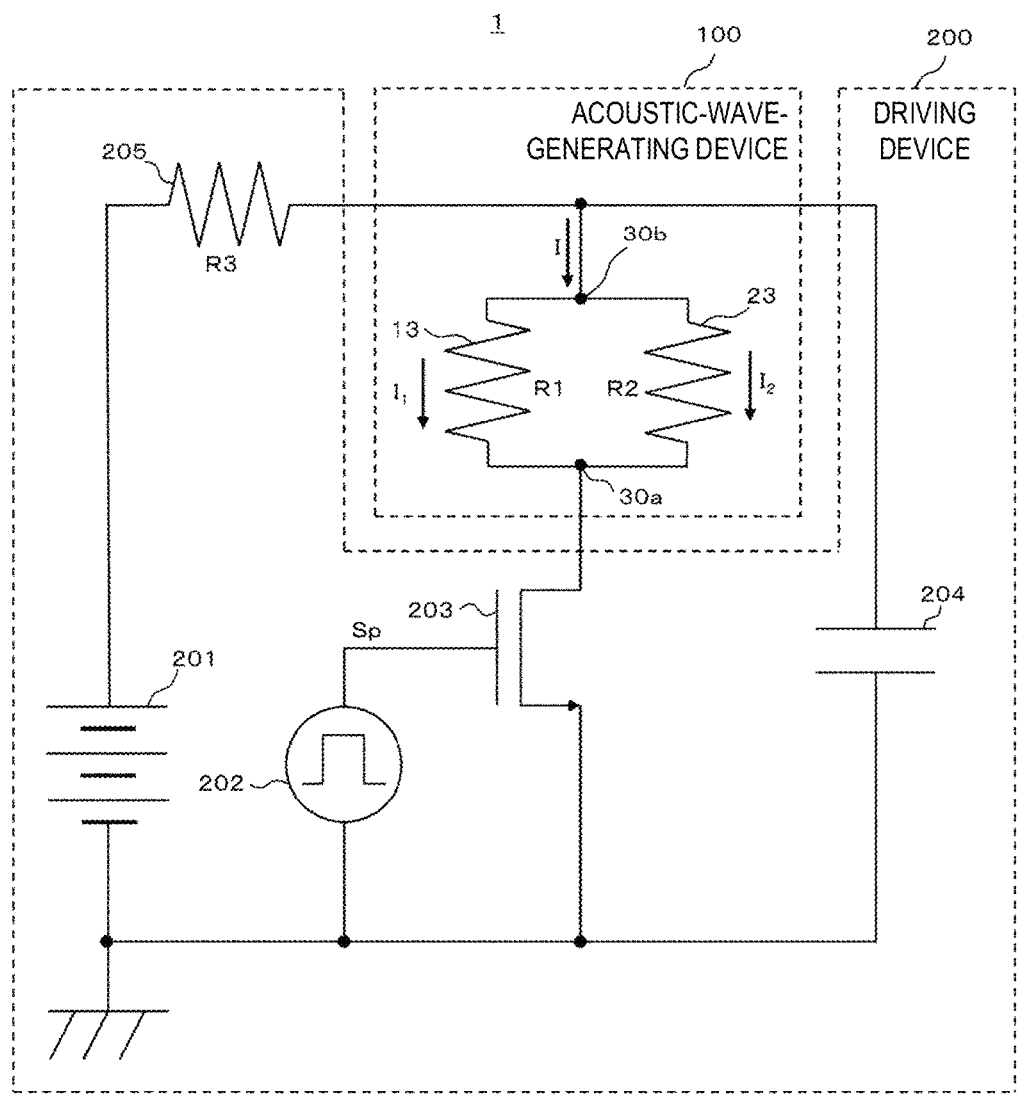
FIG. 5 is a circuit diagram of an acoustic-wave-generating system according to the first preferred embodiment of the present invention.

FIG. 5 is a circuit diagram of the acoustic-wave-generating device 100 and a driving device 200 that drives the acoustic-wave-generating device 100. The acoustic-wave-generating system 1 includes the acoustic-wave-generating device 100 and the driving device 200. In FIG. 5, the heating element 13 of the first acoustic wave source 10 is a resistor that has a resistance value R1. The heating element 23 of the second acoustic wave source 20 is a resistor that has a resistance value R2.

The driving device 200 includes a direct current power supply 201, a pulse drive circuit 202, a MOSFET 203, a capacitor 204, and a resistor 205.

The direct current power supply 201 outputs direct voltage. The direct current power supply 201 includes, for example, various kinds of power supply circuits and/or a battery. Examples of the various kinds of power supply circuits include an AC/DC converter, a DC/DC converter, a regulator, and a battery.

The pulse drive circuit 202 is connected to the gate of the MOSFET 203 and drives the MOSFET 203. The pulse drive circuit 202 includes, for example, an oscillator. The pulse drive circuit 202 generates a pulse signal Sp that represents an on-voltage Von or an off-voltage Voff, for example, based on the period and a duty ratio that are determined in advance (see FIGS. 6A and 6B). According to the present preferred embodiment, the pulse drive circuit 202 generates the pulse signal Sp including, for example, a burst wave Wb of waves (for example, 2 to 5 waves) having a duty ratio of about 50% to use the resonance. Consequently, a standing wave (acoustic wave) of the air is generated in the interior space 40. The acoustic-wave-generating device 100 is driven depending on the pulse signal Sp. Accordingly, the pulse signal Sp according to the present preferred embodiment is also referred to as a "driving signal" for driving the acoustic-wave-generating device 100. The pulse drive circuit 202 controls turning-on and turning-off of the MOSFET 203 by using the pulse signal Sp.

The MOSFET 203 is connected between the electrode 30a and a low-pressure-side end of the direct current power supply 201. For example, the source of the MOSFET 203 is grounded. The drain of the MOSFET 203 is connected to the electrode 30a. The MOSFET 203 is an example of a switching element that controls turning-on and turning-off of drive currents I that flow to the heating elements 13 and 23. In FIG. 5, the n-type MOSFET 203 is used as the switching element.

The capacitor 204 is connected in parallel to a series circuit of the heating elements 13 and 23 and the MOSFET 203 between the resistor 205 and the low-pressure-side end of the direct current power supply 201. Examples of the capacitor 204 include an electrolytic capacitor and a ceramic capacitor.

The resistor 205 is connected between a high-pressure-side end of the direct current power supply 201 and the capacitor 204. The resistor 205 has a resistance value R3. The resistor 205 is an example of a resistance element that restricts electric currents that flow from the direct current power supply 201 to the heating elements 13 and 23.

In the driving device 200 that has the above structure, the pulse drive circuit 202 outputs the pulse signal Sp to the gate of the MOSFET 203 for the pulse drive of the MOSFET 203. The MOSFET 203 is turned on (conduction) when the pulse signal Sp represents the on-voltage Von and is turned off (non-conduction) when the pulse signal Sp represents the off-voltage Voff.

While the MOSFET 203 is off, no electric currents flow to the heating elements 13 and 23, and the heating elements 13 and 23 do not generate heat. At this time, the direct voltage from the direct current power supply 201 is applied to the capacitor 204 via the resistor 205, and the capacitor 204 is charged.

While the MOSFET 203 is on, the capacitor 204 is discharged, electric currents flow from the capacitor 204 to the heating elements 13 and 23, and the heating elements 13 and 23 generate heat. The heating elements 13 and 23 generate the heat depending on the magnitudes of flowing electric currents $I_1$ and $I_2$. For example, the resistance value R3 of the resistor 205 is increased to such a degree that the electric currents that flow from the direct current power supply 201 to the heating elements 13 and 23 can be ignored against the electric currents that flow from the capacitor 204 to the heating elements 13 and 23. Consequently, even when the MOSFET 203 is turned on, and a closed circuit of the direct current power supply 201, the resistor 205, the heating elements 13 and 23, and the MOSFET 203 is formed, electric currents rarely flow from the direct current power supply 201 to the heating elements 13 and 23. Accordingly, the heating elements 13 and 23 are not overheated, and the safety of the acoustic-wave-generating device 100 can be improved, for example, even while the MOSFET 203 is always on due to malfunction.

The air is expanded and contracted in a manner in which the MOSFET 203 continues to be alternately turned on and off to continue alternately creating a state in which the air around the heating elements 13 and 23 is heated and a state in which the air is not heated. Consequently, the acoustic wave is generated.

The period of the acoustic wave that is generated by the acoustic-wave-generating device 100 through the operation of the driving device 200 will be described with reference to FIGS. 6A and 6B. FIGS. 6A and 6B illustrate timing charts illustrating the period of the acoustic wave. FIG. 6A illustrates a timing with which the pulse signal Sp is inputted into the MOSFET 203 of the driving device 200. In FIG. 6A, the horizontal axis represents time (s), and the vertical axis represents voltage (V). FIG. 6B illustrates a timing with which the acoustic wave is outputted by the acoustic-wave-generating device 100. In FIG. 6B, the horizontal axis represents time (s), and the vertical axis represents acoustic pressure (Pa).

As illustrated in FIG. 6A, the pulse signal Sp that is inputted into the gate of the MOSFET 203 exhibits the off-voltage Voff before time t1. At this time, the capacitor 204 is almost fully charged.

At time t1, the pulse signal Sp increases to the on-voltage Von (FIG. 6A), and the MOSFET 203 is turned on. The capacitor 204 then starts discharging and causes electric currents I to flow to the heating elements 13 and 23. At this time, the temperatures of the heating elements 13 and 23 increase, and the heating elements 13 and 23 heat the air therearound. Consequently, the air in the interior space 40 is thermally expanded, and the pressure (that is, the acoustic pressure) of the air increases from a steady value P0 as illustrated in FIG. 6B.

In a period Ton (also referred to below as a "pulse width") during which the MOSFET 203 is on, the electric currents I are continuously supplied to the heating elements 13 and 23 due to the discharge of the capacitor 204. In the period Ton, variations in the temperature of the air in the interior space 40 are stable, and the acoustic pressure returns to the steady value P0 (FIG. 6B).

At time t2 after the on-period Ton has elapsed since time t1, the pulse signal Sp decreases to the off-voltage Voff (FIG. 6A), and the MOSFET 203 is turned off. Consequently, the capacitor 204 stops discharging, and the supply of the electric currents I to the heating elements 13 and 23 is stopped. At this time, the heating elements 13 and 23 do not generate heat, and the air is cooled as the temperature decreases. Consequently, the air in the interior space 40 is contracted, and the acoustic pressure decreases from the steady value P0 as illustrated in FIG. 6B. Subsequently, the acoustic pressure returns to the steady value P0.

The pulse signal Sp includes the burst wave Wb having pulses (for example, 2 to 5 waves) that are generated for every pulse period Tp (=Ton+Toff) and increases again at time t3. The acoustic pressure increases or decreases depending on the on-period Ton and the off-period Toff of the pulses of the pulse signal Sp, and the acoustic wave with a period Ts depending on the pulse period Tp is generated (FIG. 6B).

The pulse signal Sp is maintained at the off-voltage Voff after the burst wave Wb. While the MOSFET 203 is off, the capacitor 204 is charged. At time t4 after a predetermined burst period Tb has elapsed since time t1, the pulse signal Sp increases again (FIG. 6A). Consequently, the acoustic wave is continuously generated depending on the burst wave Wb in the same manner described above.

The acoustic-wave-generating system 1 according to the present preferred embodiment can thus generate the acoustic wave having the pulses depending on the burst wave Wb of the pulse signal Sp for every burst period Tb as illustrated in FIG. 6B.

According to the present preferred embodiment, the frequency $f_s$ of the acoustic wave that is generated by the acoustic-wave-generating device 100 satisfies "$f_s=1/Ts$". The pulse frequency $f_p$ of the pulses of the burst wave Wb of the pulse signal Sp satisfies "$f_p=1/Tp$". The period Ts of the acoustic wave that is generated by the acoustic-wave-generating device 100 is determined depending on the magnitude of the pulse period Tp of the pulse signal Sp, and the frequency $f_s$ of the acoustic wave is determined depending on the pulse frequency $f_p$. That is, the wavelength λ of the acoustic wave in expression (1) is determined by the pulse frequency $f_p$ of the pulse signal Sp.

According to the present preferred embodiment, the pulse frequency $f_p$ of the burst wave Wb of the pulse signal Sp and the length $L_y$ of the interior space 40 between the openings 41a and 41b are determined depending on the frequency $f_s$ of the acoustic wave to be outputted.

Since the acoustic-wave-generating device 100 according to the present preferred embodiment has the open tube structure, the air column in the interior space 40 has a natural frequency depending on the length $L_y$ of the interior space 40 between the openings 41a and 41b as defined as expression (2). In expression (2), c is an acoustic velocity (about 346.5 m/sec at about 25° C.)

[Expression 2]

$$f_r = \frac{c}{2L_y} \times n \qquad (2)$$

According to the present preferred embodiment, the air column resonance is used. Accordingly, the pulse frequency $f_p$ of the burst wave Wb of the pulse signal Sp is determined such that the frequency $f_s$ of the acoustic wave that is outputted by the acoustic-wave-generating device 100 is equal or substantially equal to the natural frequency $f_r$ of the air column in the interior space 40. In the above expression (2), for example, when $L_y$=about 4 mm, and c=about 346.5 m/sec, the natural frequency $f_r$ of the air column is about 43 kHz. In this case, the pulse frequency $f_p$ of the burst wave Wb of the pulse signal Sp is determined such that the frequency $f_s$ of the acoustic wave is, for example, about 43 kHz ($f_s=f_r$).

FIG. 7 illustrates the result of a simulation of an acoustic pressure amplitude when $L_y$=about 4 mm, c=about 346.5 m/sec, and the frequency of a continuous sine wave is changed, and the simulation is performed to check the effect of the resonance. In FIG. 7, the horizontal axis represents the frequency (Hz) of the sine wave, and the vertical axis represents the acoustic pressure amplitude (arb.unit). In FIG. 7, a solid line 71 represents the acoustic pressure amplitude of an acoustic wave that is generated in the acoustic-wave-generating device 100 according to the present preferred embodiment, that is, with the first acoustic wave source 10 and the second acoustic wave source 20 facing each other. A dashed line 72 represents the acoustic pressure amplitude of an acoustic wave that is generated by a single acoustic wave source, that is, an existing acoustic-wave-generating device that includes no facing structure. In the simulation, as illustrated by the solid line 71, a frequency $f_{r1}$ at which a peak value of the acoustic pressure amplitude is obtained is about 34 kHz. A half width in the simulation in FIG. 7 is about 8 kHz. As illustrated by the solid line 71 and the dashed line 72, the maximum of the acoustic pressure that can be obtained by the acoustic-wave-generating device 100 according to the present preferred embodiment is about 14 times that in the case of the single acoustic wave source.

Figure 8:
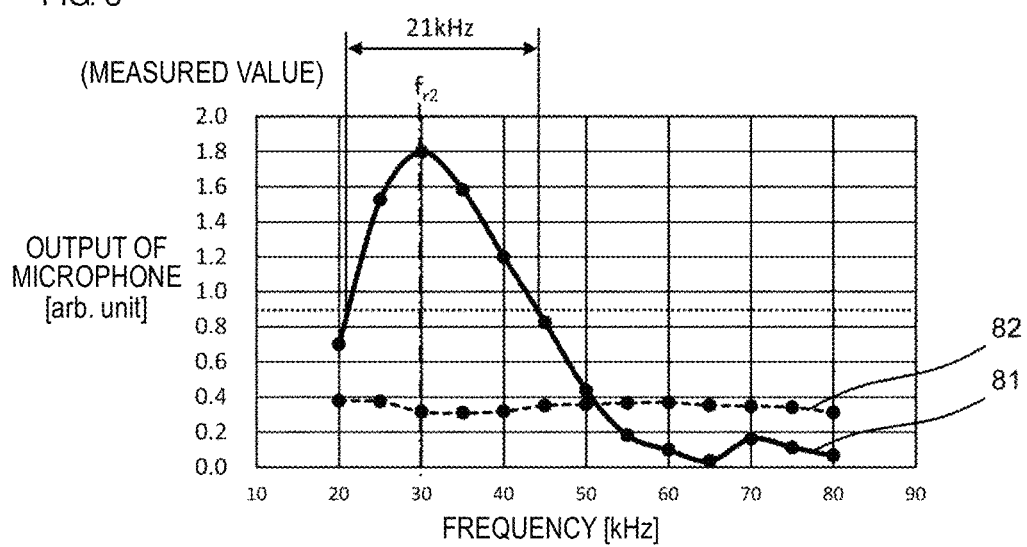
FIG. 8 is a graph illustrating a measured value of the thermal excitation acoustic-wave-generating device according to the first preferred embodiment of the present invention.

FIG. 8 illustrates the measured value of the output of a MEMS microphone when the pulse frequency $f_p$ of the burst wave Wb of 5 pulses having a duty ratio of about 50% is changed in an environment (c=about 346.5 m/sec) at about 25° C. with the MEMS microphone disposed near an open end of the acoustic-wave-generating device 100 having a length $L_y$ of about 4 mm. In FIG. 8, the horizontal axis represents the pulse frequency $f_p$ (kHz) corresponding to "1/Tp". The vertical axis represents the output (arb.unit) of the microphone. In FIG. 8, a solid line 81 represents an output value in the case of the acoustic-wave-generating device 100 according to the present preferred embodiment, that is, with the first acoustic wave source 10 and the second acoustic wave source 20 facing each other. A dashed line 82 represents an output value in the case of the single acoustic wave source, that is, the existing acoustic-wave-generating device that includes no facing structure. As illustrated by the solid line 81, the measured value of the frequency $f_{r2}$ at which a peak value of the output of the microphone is obtained is about 30 kHz. In measurement in FIG. 8, the half width is about 21 kHz.

In practice, it can be assumed that the position (n×λ/2) of an anti-node of the pressure wave in the interior space 40 is slightly outside the openings 41a and 41b. It can also be assumed that the period Ts of the acoustic wave is slightly longer than the pulse period Tp of the pulse signal Sp in some cases. Accordingly, as illustrated by the result of the simulation in FIG. 7 and the measured value in FIG. 8, the frequencies $f_{r1}$ (about 34 kHz) and $f_{r2}$ (about 30 kHz) at which the effect of the air column resonance is maximized do not necessarily coincide with the natural frequency $f_r$ (about 43 kHz) that is theoretically calculated by using expression (2) but is close to the natural frequency $f_r$. Accordingly, the pulse frequency $f_p$ may be determined in consideration of a difference between the pulse frequency $f_p$ of the pulse signal Sp and the natural frequency $f_r$ that is calculated by using expression (2).

The solid line 71 in FIG. 7 and the solid line 81 in FIG. 8 are compared with the dashed line 72 in FIG. 7 and the dashed line 82 in FIG. 8. From the comparison, it can be understood that the half of the peak value of the calculated acoustic pressure amplitude and the half of the peak value of the output of the microphone are higher than those in the case of the single acoustic wave source. That is, it can be understood that the advantageous effect of the air column resonance is sufficiently obtained, provided that the frequency $f_s$ of the acoustic wave is within the range (for example, about ±20% of $f_r$) of a value close to the natural frequency $f_r$ of the air column. Accordingly, in the acoustic-wave-generating system 1, the pulse frequency $f_p$ of the pulse signal Sp may be determined such that the acoustic pressure amplitude illustrated in FIG. 7 is equal to or more than half of the peak value, or the output of the microphone illustrated in FIG. 8 is equal to or more than half of the peak value. In other words, the frequency $f_s$ of the acoustic wave to be outputted is determined such that the frequency $f_s$ of the acoustic wave satisfies "$f_s=(1\pm\alpha) f_r$" (for example, $0 \leq \alpha \leq 0.2$) with respect to the natural frequency $f_r$ of the air column. In the case where the frequency $f_s$ of the acoustic wave is determined with $\alpha \approx 0.2$, the length $L_y$ of the path has a margin of error ranging between about ±20% of n/2 times the wavelength corresponding to the natural frequency $f_r$ of the air column.

The acoustic-wave-generating system 1 thus determines the pulse frequency $f_p$ of the pulse signal Sp and the distance $L_y$ between both ends of the interior space 40 (that is, the path) in the direction in which the acoustic wave propagates such that the air column resonance occurs, based on the frequency $f_s$ of the acoustic wave to be outputted. Provided that the acoustic-wave-generating system 1 can use the effect of the air column resonance, the length $L_y$ of the interior space 40 between the openings 41a and 41b may be determined depending on the pulse frequency $f_p$ of the pulse signal Sp. For example, the length $L_y$ may be determined within about ±20% of a standard value that is equal to n/2 times the wavelength λ of the acoustic wave that is defined by the pulse signal Sp. The pulse frequency $f_p$ of the pulse signal Sp may be determined depending on the length $L_y$ of the interior space 40 between the openings 41a and 41b.

3. Summary

The thermal excitation acoustic-wave-generating device 100 according to the present preferred embodiment includes the heating element 13, the substrate 11 that includes a main surface along which the heating element 13 is disposed, and the facing body 21 that faces the substrate 11 with the heating element 13 interposed therebetween. The substrate 11 and the facing body 21 define the interior space 40 in which the acoustic wave is generated, that is, define the path for the acoustic wave. The length $L_y$ of the path is close to a whole number multiple of ¼ of the wavelength of the acoustic wave.

A value "close to a whole number multiple of ¼ of the wavelength of the acoustic wave" means a value that enables the air column resonance to be used on the path and that is within a predetermined range when a standard value is n/4 times the wavelength λ. According to the present preferred embodiment, both ends of the path are the open ends. Accordingly, the length $L_y$ of the path is specifically close to a whole number multiple of ½ of the wavelength of the acoustic wave. The range of being close includes a whole number multiple of ½ of the wavelength of the acoustic wave at the frequency $f_s$ that satisfies "$f_s=(1\pm\alpha) f_r$" (for example, 0≤α≤0.2), when based on the natural frequency $f_r$ of the air column. In this case, the air column resonance occurs on the path, and the efficiency with which the acoustic wave is generated can be improved.

The separation distance (that is, the height $L_z$ of the interior space 40) between the substrate 11 and the facing body 21 is less than the length $L_y$ of the path. This restricts the diffusion of the pressure wave in the height direction on the path and facilitates the diffusion thereof in the horizontal direction.

The surface of the substrate 11 that faces the facing body 21 is flat. The surface of the facing body 21 that faces the substrate 11 is flat. This reduces or prevents diffusion in an undesired direction from occurring.

A pair of reflectors that reflect the acoustic wave are disposed along the path between the substrate 11 and the facing body 21. The path is defined between the substrate 11 and the facing body 21 and between the pair of reflectors. According to the present preferred embodiment, the pair of electrodes 30a and 30b that are connected to the heating element 13 and that supply the electric current to the heating element 13 define and function as the pair of reflectors. The reflectors enable the energy of the pressure wave that flows in directions except for the direction (Y-direction) toward the openings to be guided toward the openings along the reflectors. Consequently, the energy of the pressure wave that is outputted from the openings increases.

The substrate 11 and the facing body 21 are held with the electrodes 30a and 30b that define and function as the reflectors interposed therebetween This enables the electrodes 30a and 30b to define and function as spacers and enables the path to be defined between the first acoustic wave source 10 and the second acoustic wave source 20.

The heating element 23 is disposed on the surface of the facing body 21 that faces the substrate 11. The heating elements 13 and 23 enable the acoustic pressure of the acoustic wave that is generated to be increased. Since the heating elements 13 and 23 are located between the first acoustic wave source 10 and the second acoustic wave source 20 that face each other, the size of the acoustic-wave-generating device 100 can be decreased.

The heating element 23 is connected to the common electrodes 30a and 30b. This achieves the effect of the air column resonance also regarding the pressure wave that is generated by heating of the heating element 23. The heating elements 13 and 23 are supplied with power via the common electrodes 30a and 30b, and the number of circuit components can be decreased.

The path has a quadrangular or substantially quadrangular prism shape. This prevents turbulence from occurring on the path.

The acoustic-wave-generating system 1 according to the present preferred embodiment includes the thermal excitation acoustic-wave-generating device 100 and the driving device 200 that supplies the pulse signal (driving signal) Sp to the acoustic-wave-generating device 100. The wavelength of the acoustic wave is defined by the driving signal. This enables the efficiency with which the acoustic wave is generated to be improved depending on the driving signal.

Second Preferred Embodiment

According to the first preferred embodiment, the acoustic-wave-generating device 100 has the open tube structure. According to a second preferred embodiment of the present invention, the acoustic-wave-generating device 100 has a closed tube structure. The acoustic-wave-generating device 100 according to the second preferred embodiment will now be described.

Figure 9:
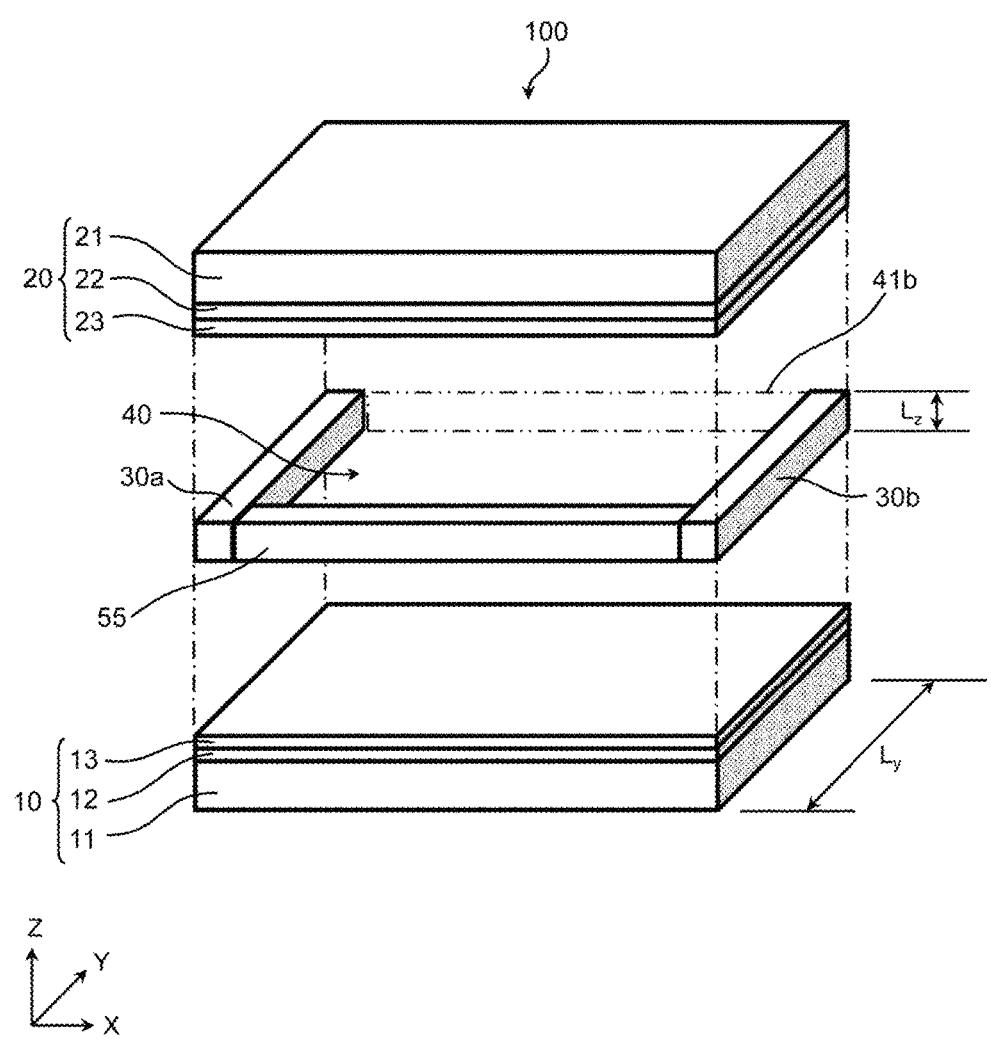
FIG. 9 is an exploded perspective view of the structure of a thermal excitation acoustic-wave-generating device according to a second preferred embodiment of the present invention.

FIG. 9 is an exploded perspective view of the structure of the acoustic-wave-generating device 100 according to the second preferred embodiment. The acoustic-wave-generating device 100 according to the present preferred embodiment includes a block body 55 in addition to the components according to the first preferred embodiment. The block body 55 defines a closed end (a fixed end) of the interior space 40. Specifically, the block body 55 is disposed between the first acoustic wave source 10 and the second acoustic wave source 20 and between the electrodes 30a and 30b so as to block a first end of the path, that is, a first end of the interior space 40 in the Y-direction. Accordingly, the acoustic-wave-generating device 100 according to the present preferred embodiment includes the single opening 41b. The acoustic-wave-generating device 100 has the closed tube structure that is defined by the first acoustic wave source 10, the second acoustic wave source 20, the electrodes 30a and 30b, and the block body 55.

Figure 10A:
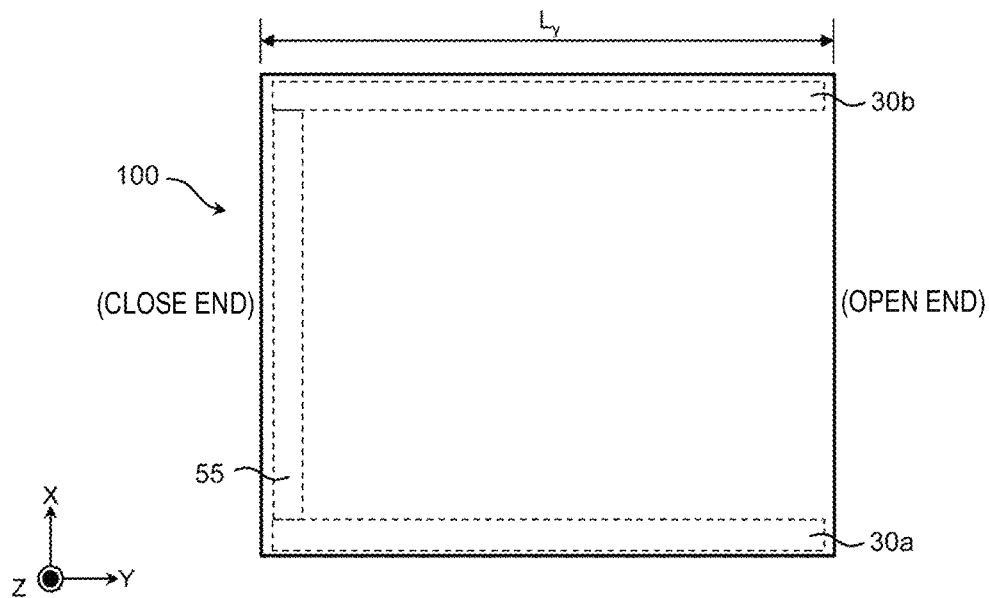
FIGS. 10A and 10B are diagrams for describing the length of an interior space in a direction in which an acoustic wave propagates in the thermal excitation acoustic-wave-generating device according to the second preferred embodiment of the present invention.
Figure 10B:
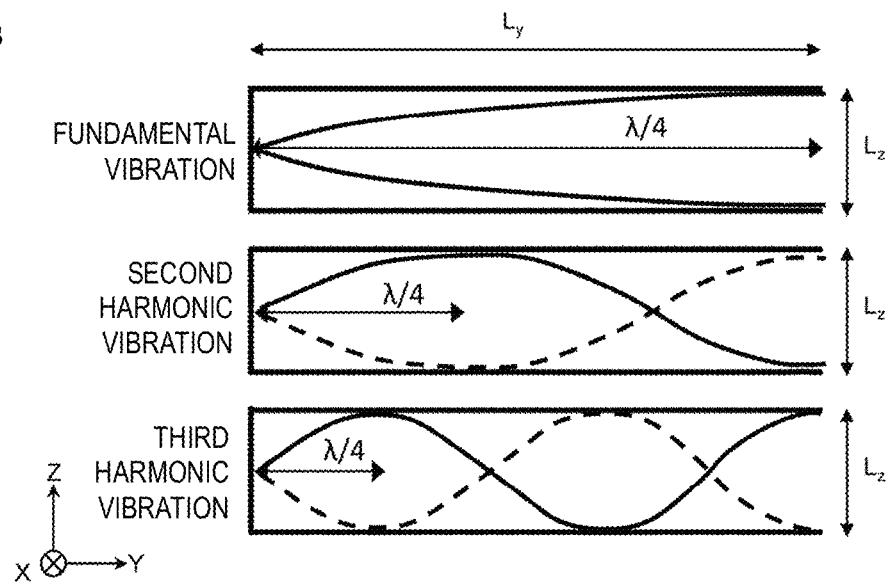

FIG. 10A is a plan view of the acoustic-wave-generating device 100 according to the second preferred embodiment. FIG. 10B illustrates the waveform of the acoustic wave that is the pressure wave in the interior space 40 according to the second preferred embodiment. According to the present preferred embodiment, as defined as expression (3), the lengths $L_y$ of the substrate 11 and the facing body 21 in the Y-direction are determined such that the length $L_y$ between the close end and the open end of the interior space 40 is close to an odd number multiple (2 n−1) of ¼ of the wavelength of the pressure wave that is generated in the interior space 40. In expression (3), n is an integer (for example, n=1, 2, or 3). For example, it is determined to be n=1.

[Expression 3]

$$L_y = \frac{\lambda}{4} \times (2n-1) \quad (3)$$

The closed tube structure has the natural frequency $f_r$ depending on the length $L_y$ of the interior space 40 in the Y-direction as defined as expression (4). In expression (4), c is the acoustic velocity.

[Expression 4]

$$f_r = \frac{c}{4L_y} \times (2n-1) \quad (4)$$

The driving device 200 determines the pulse frequency $f_p$ (=1/Tp) of the burst wave Wb of the pulse signal Sp such that the frequency $f_s$ of the acoustic wave satisfies "$f_s=(1\pm\alpha) f_r$" (for example, $0\le\alpha\le0.2$) as in the first preferred embodiment. In this case, the air column resonance occurs in the interior space 40, and the acoustic pressure increases.

In the acoustic-wave-generating device 100 according to the present preferred embodiment, one of the ends of the interior space 40 (path) in the direction in which the acoustic wave propagates is the open end, and the other is the closed end. The length $L_y$ of the path is close to an odd number multiple of ¼ of the wavelength of the acoustic wave. The range of being close includes an odd number multiple of ¼ of the wavelength of the acoustic wave at the frequency $f_s$ that satisfies "$f_s=(1\pm\alpha) f_r$" (for example, $0\le\alpha\le0.2$) with respect to the natural frequency $f_r$ of the air column. In this case, the air column resonance occurs in the interior space 40, and the efficiency with which the acoustic wave is generated is improved as in first preferred embodiment.

Other Preferred Embodiments

In an example described according to the first and second preferred embodiments, the first acoustic wave source 10 and the second acoustic wave source 20 have a flat plate shape, and the openings 41a and 41b are provided between the first acoustic wave source 10 and the second acoustic wave source 20. However, the structure of the acoustic-wave-generating device 100 is not limited thereto, provided that the acoustic-wave-generating device 100 uses the resonance. Another structure of the acoustic-wave-generating device 100 will now be described with reference to FIG. 11 to FIG. 18.

Figure 11:
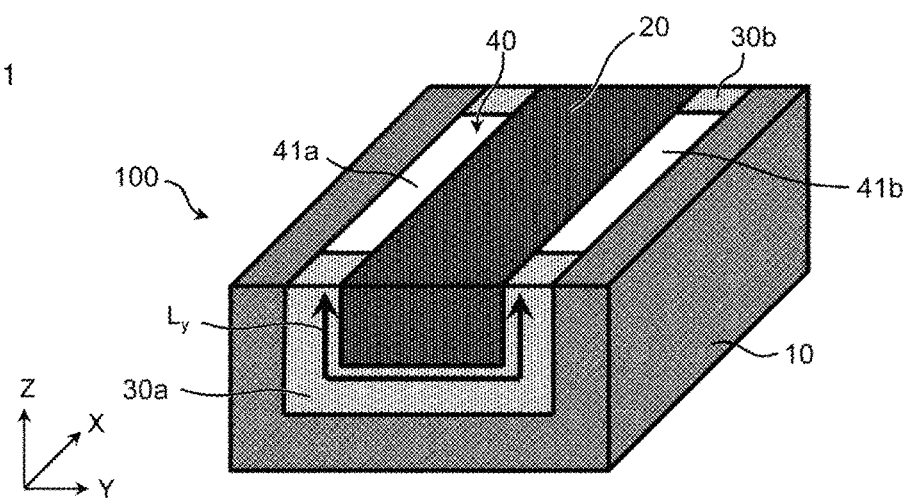
FIG. 11 is a perspective view of a modification to a thermal excitation acoustic-wave-generating device according to a preferred embodiment of the present invention.
Figure 12:
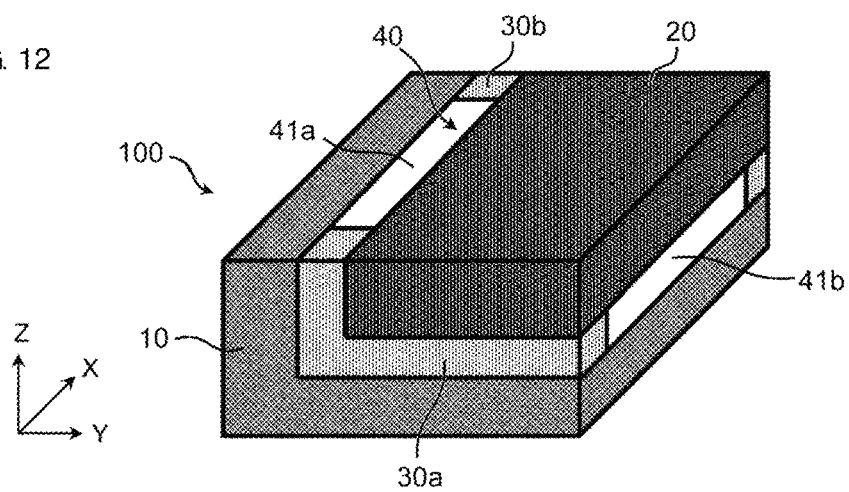
FIG. 12 is a perspective view of a modification to a thermal excitation acoustic-wave-generating device according to a preferred embodiment of the present invention.
Figure 13:
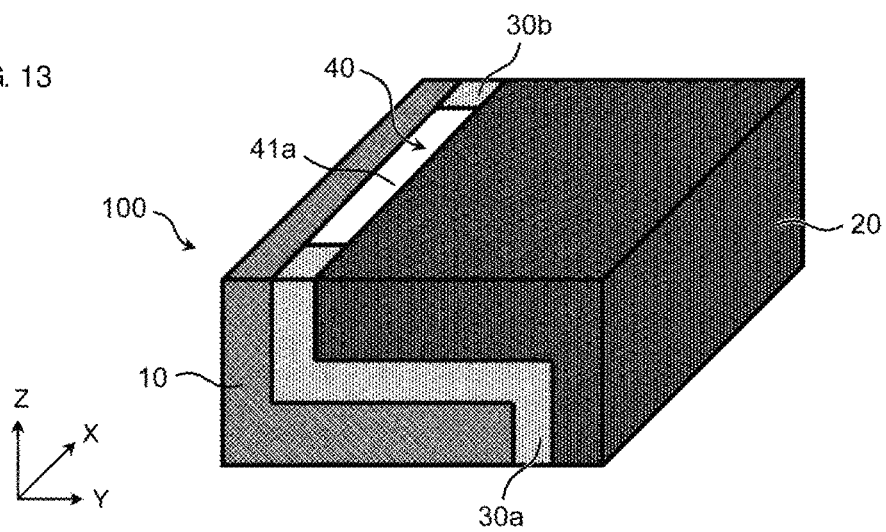
FIG. 13 is a perspective view of a modification to a thermal excitation acoustic-wave-generating device according to a preferred embodiment of the present invention.

FIG. 11 to FIG. 13 illustrate modifications to the acoustic-wave-generating device 100. In an example in FIG. 11, the first acoustic wave source 10 has a recessed shape, and the second acoustic wave source 20 has a flat plate shape. In an example in FIG. 12, the first acoustic wave source 10 has an L-shape, and the second acoustic wave source 20 has a flat plate shape. In an example in FIG. 13, the first acoustic wave source 10 and the second acoustic wave source 20 have an L-shape. In FIG. 11 to FIG. 13, the heating elements 13 and 23 are disposed on a surface of the first acoustic wave source 10 and a surface of the second acoustic wave source 20 that face each other. In FIG. 11 to FIG. 13, the interior space (path) 40 is defined by the first acoustic wave source 10, the second acoustic wave source 20, and the electrodes 30a and 30b. In FIG. 11 to FIG. 13, the first acoustic wave source 10, the second acoustic wave source 20, and the electrodes 30a and 30b are illustrated by hatching to make the interior space (path) 40 clear. For example, in FIG. 11, the interior space 40 is defined such that a recessed shape on the YZ plane expands in the X-direction. In FIG. 11 to FIG. 13, the length $L_y$ of the interior space (path) 40 corresponds to the minimum distance between the openings 41a and 41b in the interior space (path) 40. In the example in FIG. 11, the length $L_y$ of the interior space (path) 40 corresponds to a length along outer edges of the second acoustic wave source 20 in the interior space 40 in the recessed shape.

Figure 14:
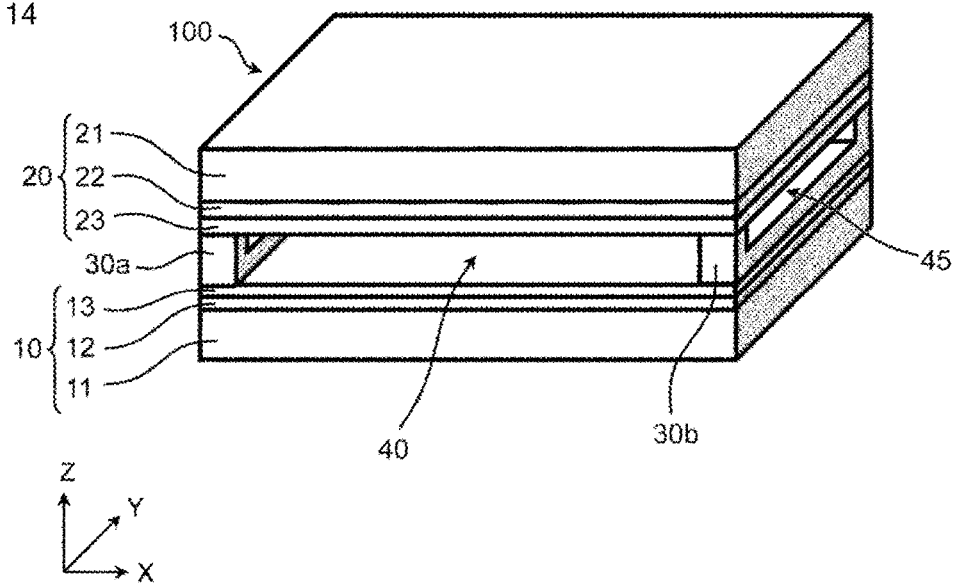
FIG. 14 is a perspective view of a modification to a thermal excitation acoustic-wave-generating device according to a preferred embodiment of the present invention.
Figure 15:
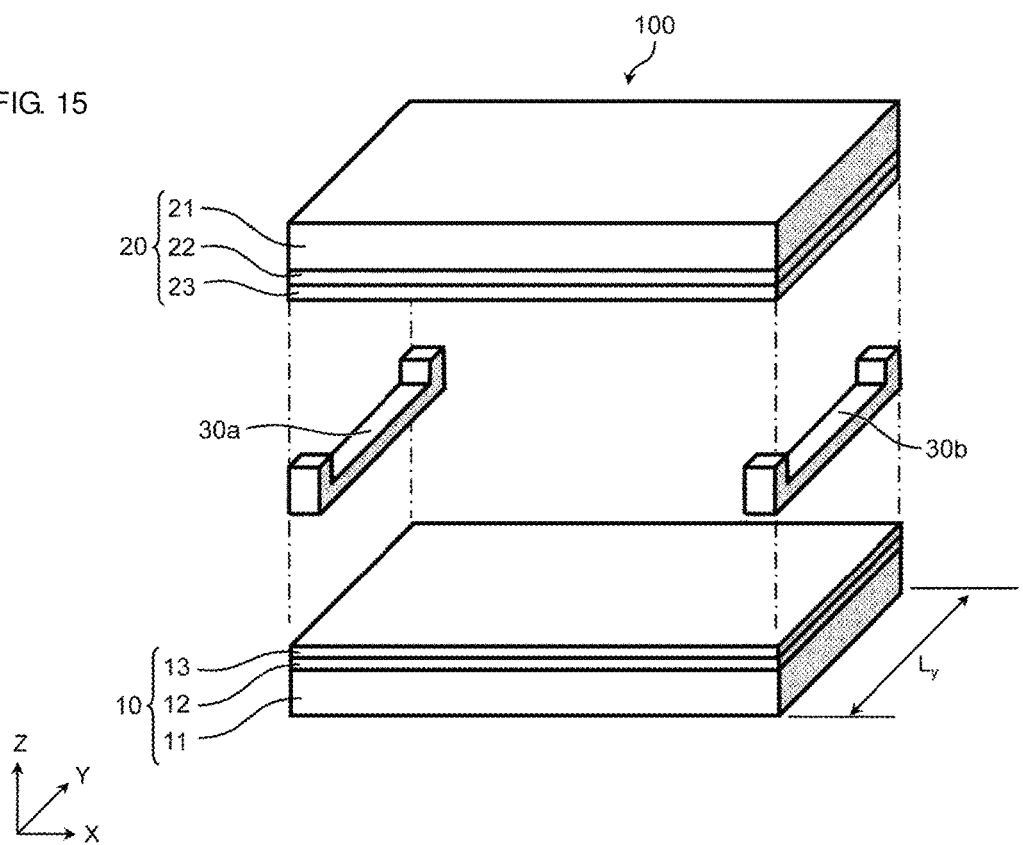
FIG. 15 is an exploded perspective view of the acoustic-wave-generating device in FIG. 14.

FIG. 14 is a perspective view of another modification to the acoustic-wave-generating device 100. FIG. 15 is an exploded perspective view of the acoustic-wave-generating device 100 in FIG. 14. In the acoustic-wave-generating device 100, the second acoustic wave source 20 is held above the first acoustic wave source 10 by using the electrodes 30a and 30b that have a recessed shape. Accordingly, there are gaps 45 at both ends in the direction (X-direction) perpendicular or substantially perpendicular to the direction in which the acoustic wave propagates in the interior space 40. Also, in this case, the advantageous effect of the resonance is achieved.

Figure 16:
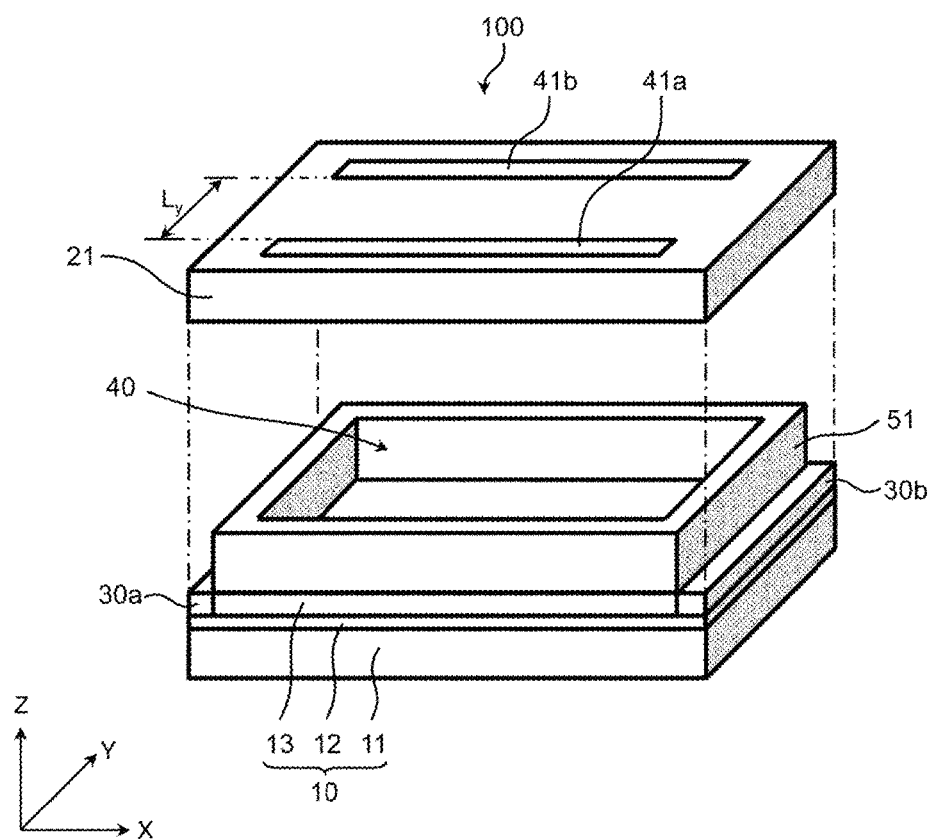
FIG. 16 is a perspective view of a modification to a thermal excitation acoustic-wave-generating device according to a preferred embodiment of the present invention.

FIG. 16 illustrates another modification to the acoustic-wave-generating device 100. According to the above preferred embodiments, the openings 41a and 41b are provided between the first acoustic wave source 10 and the second acoustic wave source 20. In an example in FIG. 16, however, the openings 41a and 41b are through-holes that are provided in the facing body 21. The acoustic-wave-generating device 100 in FIG. 16 includes neither the thermal insulation layer 22 nor the heating element 23. The acoustic-wave-generating device 100 includes a spacer 51 between the heating element 13 and the facing body 21. The interior space 40 is defined by the spacer 51. Also, in this case, the distance $L_y$ between the openings 41a and 41b is designed so as to satisfy expression (1). The openings 41a and 41b may be through-holes that are provided in the first acoustic wave source 10. One of the through-holes that correspond to the openings 41a and 41b may be provided in the first acoustic wave source 10, and the other may be provided in the second acoustic wave source 20.

Figure 17:
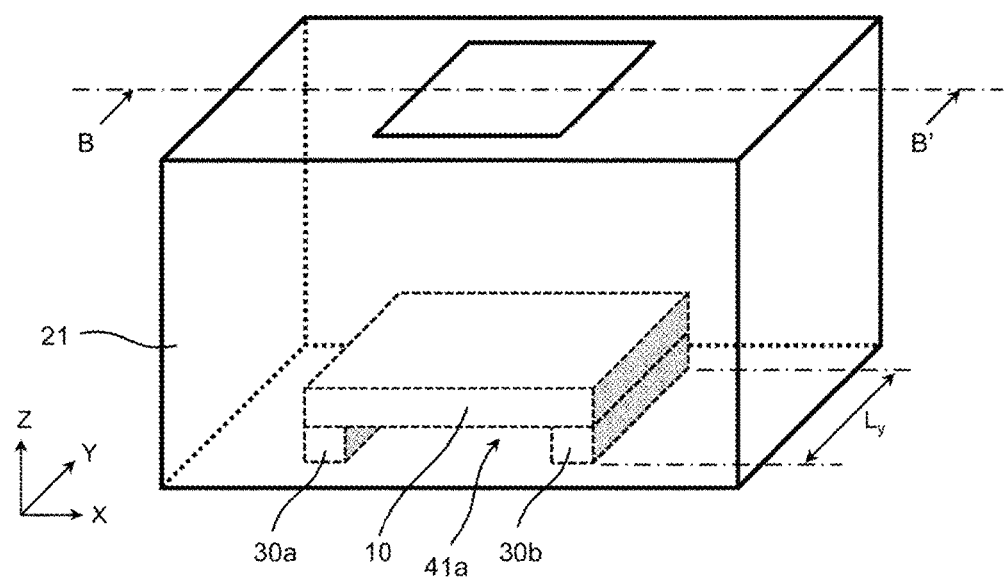
FIG. 17 is a perspective view of a modification to a thermal excitation acoustic-wave-generating device according to a preferred embodiment of the present invention.
Figure 18:
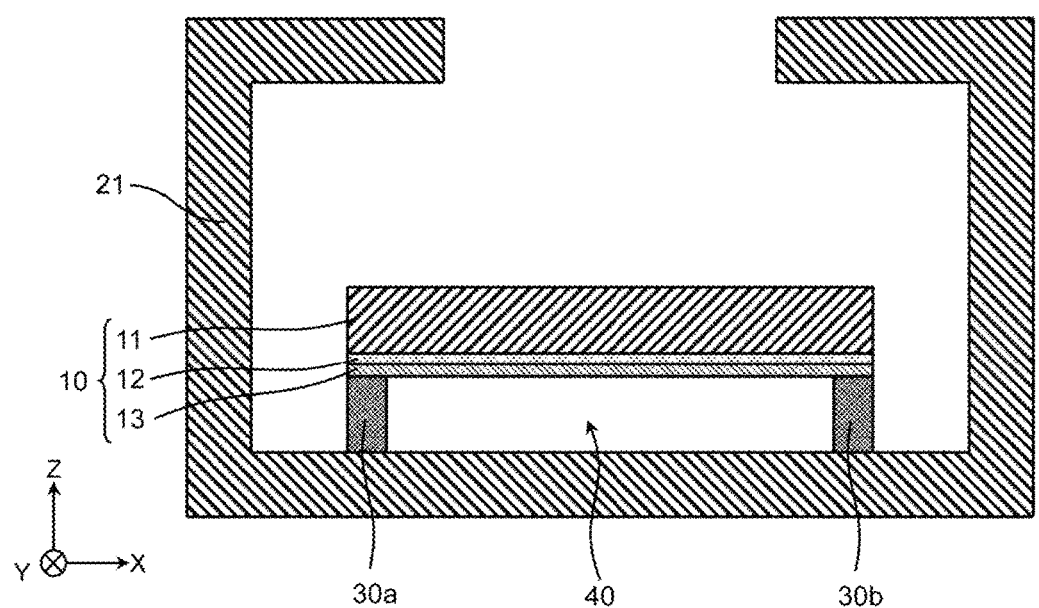
FIG. 18 is a sectional view of the acoustic-wave-generating device in FIG. 17.

FIG. 17 illustrates another modification to the acoustic-wave-generating device 100. FIG. 18 is a sectional view of the acoustic-wave-generating device 100 taken along line B-B' in FIG. 17. The acoustic-wave-generating device 100 illustrated in FIG. 17 and FIG. 18 includes neither the thermal insulation layer 22 nor the heating element 23. The facing body 21 in FIG. 17 is a housing. The housing is preferably made of, for example, an insulating material. The first acoustic wave source 10 is disposed above the bottom surface of the housing with the electrodes 30a and 30b interposed therebetween such that the heating element 13 faces the housing. The interior space 40 is provided between the facing body 21 that is the housing and the first acoustic wave source 10.

According to the above preferred embodiments, the acoustic-wave-generating device 100 may include the two openings 41a and 41b or may include only one of the openings 41a and 41b. That is, in the case of the open tube structure, it is only necessary for the length $L_y$ of the interior space (path) 40 to satisfy expression (1). In the case of the closed tube structure, it is only necessary for the length $L_y$ of the interior space (path) 40 to satisfy expression (3).

According to the above preferred embodiments, the heating elements 13 and 23 are connected to the common electrodes 30a and 30b. However, the heating elements 13 and 23 may be connected to different pairs of electrodes. In the case where the drive currents I are supplied to the heating elements 13 and 23 on the first acoustic wave source 10 and the second acoustic wave source 20 via the common electrodes 30a and 30b, the number of the circuit components can be decreased.

According to the above preferred embodiments, only the first acoustic wave source 10 or the second acoustic wave source 20 may include a heating element. Also, in the case of the single heating element, the air column resonance can occur. In the case where the first acoustic wave source 10 and the second acoustic wave source 20 that face each other include the respective heating elements, the acoustic pressure can be increased. In the case where the two heating elements 13 and 23 face each other, the size of the acoustic-wave-generating device 100 can be decreased.

According to the above preferred embodiments, the electrodes 30a and 30b define and function as the reflectors that reflect the acoustic wave within the interior space 40. However, it is only necessary for the reflectors to extend in the direction (Y-direction) in which the acoustic wave propagates between the first acoustic wave source 10 and the second acoustic wave source 20. For example, the reflectors may be separated from the electrodes 30a and 30b or may partially include the electrodes 30a and 30b. In this case, the second acoustic wave source 20 is held above the first acoustic wave source 10 by the reflectors. The reflectors may define and function as spacers. The interior space 40 may be defined by the first acoustic wave source 10, the second acoustic wave source 20, and the reflectors.

According to the above preferred embodiments, coating layers such as thin heat-transfer layers that are electrically insulative may be provided on the surfaces (for example, the upper surface of the heating element 13 and the lower surface of the heating element 23) of the heating elements 13 and 23 that face each other.

Preferred embodiments of the present invention are useful for thermal excitation acoustic-wave-generating devices and acoustic-wave-generating systems that each generate an acoustic wave.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A thermal excitation acoustic-wave-generating device comprising:
   a first heating element;
   a substrate that includes a main surface along which the first heating element is disposed; and
   a facing body that faces the substrate with the first heating element interposed therebetween; wherein
   the substrate and the facing body define a path for an acoustic wave;
   a length of the path is close to a whole number multiple of ¼ of a wavelength of the acoustic wave;
   a pair of reflectors that reflect the acoustic wave are disposed along the path between the substrate and the facing body;
   the pair of reflectors are a pair of electrodes that are connected to the first heating element and that supply an electric current to the first heating element; and
   the path is defined between the substrate and the facing body and between the pair of reflectors.

2. The thermal excitation acoustic-wave-generating device according to claim 1, wherein
   both ends of the path are open ends; and
   the length of the path is close to a whole number multiple of ½ of the wavelength of the acoustic wave.

3. The thermal excitation acoustic-wave-generating device according to claim 1, wherein
   a first end of the path is an open end, and a second end thereof is a closed end; and
   the length of the path is close to an odd number multiple of 1/4 of the wavelength of the acoustic wave.

4. The thermal excitation acoustic-wave-generating device according to claim 1, wherein a separation distance between the substrate and the facing body is less than the length of the path.

5. The thermal excitation acoustic-wave-generating device according to claim 1, wherein
   the surface of the substrate that faces the facing body is flat; and
   a surface of the facing body that faces the substrate is flat.

6. The thermal excitation acoustic-wave-generating device according to claim 1, wherein the substrate and the facing body are held with the pair of reflectors interposed therebetween.

7. The thermal excitation acoustic-wave-generating device according to claim 1, wherein a second heating element is disposed on a surface of the facing body that faces the substrate.

8. The thermal excitation acoustic-wave-generating device according to claim 1, wherein
   a second heating element is disposed on a surface of the facing body that faces the substrate; and
   the second heating element is connected to the pair of electrodes.

9. The thermal excitation acoustic-wave-generating device according to claim 1, wherein the path has a quadrangular or substantially quadrangular prism shape.

10. An acoustic-wave-generating system comprising:
    the thermal excitation acoustic-wave-generating device according to claim 1 that generates the acoustic wave; and
    a driving device that supplies a driving signal to the acoustic-wave-generating device; wherein
    the wavelength of the acoustic wave is defined by the driving signal.

11. The acoustic-wave-generating system according to claim 10, wherein
    both ends of the path are open ends; and
    the length of the path is close to a whole number multiple of 1/2 of the wavelength of the acoustic wave.

12. The acoustic-wave-generating system according to claim 10, wherein
    a first end of the path is an open end, and a second end thereof is a closed end; and
    the length of the path is close to an odd number multiple of 1/4 of the wavelength of the acoustic wave.

13. The acoustic-wave-generating system according to claim 10, wherein a separation distance between the substrate and the facing body is less than the length of the path.

14. The acoustic-wave-generating system according to claim 10, wherein
    the surface of the substrate that faces the facing body is flat; and
    a surface of the facing body that faces the substrate is flat.

15. The acoustic-wave-generating system according to claim 10, wherein the substrate and the facing body are held with the pair of reflectors interposed therebetween.

16. The acoustic-wave-generating system according to claim 10, wherein a second heating element is disposed on a surface of the facing body that faces the substrate.

\* \* \* \* \*